United States Patent [19]

Ishizaka et al.

[11] Patent Number: 5,047,111
[45] Date of Patent: Sep. 10, 1991

[54] METHOD OF FORMING A METAL SILICIDE FILM

[75] Inventors: Akitoshi Ishizaka, Kokubunji; Yasuhiro Shiraki, Hino; Takashi Ohshima, Kokubunji, all of Japan

[73] Assignee: Director-General of the Agency of Industrial Science and Technology, Tokyo, Japan

[21] Appl. No.: 110,580

[22] Filed: Oct. 16, 1987

Related U.S. Application Data

[63] Continuation of Ser. No. 838,714, Mar. 12, 1986, abandoned.

[30] Foreign Application Priority Data

Mar. 16, 1985 [JP] Japan .................................. 60-51603
Nov. 9, 1985 [JP] Japan ................................ 60-249961

[51] Int. Cl.$^5$ .............................................. C30B 1/10
[52] U.S. Cl. ..................... 156/603; 156/610; 156/DIG. 64; 156/DIG. 73; 156/DIG. 100; 156/DIG. 103
[58] Field of Search ....... 156/603, 610, 611, DIG. 64, 156/DIG. 73, DIG. 103, DIG. 100

[56] References Cited

U.S. PATENT DOCUMENTS

| | | | |
|---|---|---|---|
| 3,716,407 | 2/1973 | Kahn | 427/91 |
| 4,088,515 | 5/1978 | Blakeslee et al. | 156/610 |
| 4,159,919 | 7/1979 | McFee et al. | 156/610 |
| 4,477,308 | 10/1984 | Gibsen et al. | 156/612 |
| 4,492,971 | 1/1985 | Bean et al. | 357/15 |
| 4,545,115 | 10/1985 | Bauer et al. | 148/174 |
| 4,554,030 | 11/1985 | Hasima | 156/DIG. 70 |
| 4,554,045 | 11/1985 | Bean et al. | 156/DIG. 102 |
| 4,707,197 | 11/1987 | Hensel et al. | 437/189 |
| 4,755,256 | 7/1988 | Ditchek | 156/DIG. 64 |

*Primary Examiner*—Robert Kunemund
*Attorney, Agent, or Firm*—Antonelli, Terry, Stout & Kraus

[57] ABSTRACT

Films of desired metal, e.g., Ni or Co, and of Si are laminated alternately on a single crystal silicon substrate to form a multi-layered structure, and thereafter the substrate is heated to grow an epitaxial $NiSi_2$ or $CoSi_2$ film in solid phase with less diffusion of Ni or Co atoms into the silicon substrate. Each layer in the multi-layered structure has a thickness selected in the range of 30-300 Å with the overall composition ratio Si/Ni (or Si/Co) in the range of 1.8-2.0. The lamination process is done at a substrate temperature which does not cause the laminated films to react with the substrate and does not cause the multi-layered structure to become polycrystalline, e.g. below 350° C. for the formation of an $NiSi_2$ film or below 450° C. for the formation of a $CoSi_2$ film. The solid phase epitaxy is achieved at a substrate heating temperature in a range of 350°–750° C. for the formation of an epitaxial $NiSi_2$ film or 450°–1000° C. for the formation of a $CoSi_2$ film.

8 Claims, 2 Drawing Sheets

(a)

(b)

(a)

(b)

METHOD OF FORMING A METAL SILICIDE FILM

This application is a continuation of application Ser. No. 838,714, filed Mar. 12, 1986, now abandoned.

BACKGROUND OF THE INVENTION

This invention relates to a method of forming a metal silicide film and, particularly, to a solid phase epitaxial method capable of easily forming a high quality monocrystalline $NiSi_2$ or $CoSi_2$ film, particularly adapted for use in semiconductor devices, with less influence of impurity diffusion from the $NiSi_2$ or $CoSi_2$ film to the Si substrate.

In semiconductor devices, a metal silicide film is used to form ohmic or Schottky barrier contacts. There have been known, as methods of growing epitaxially a monocrystalline film of $NiSi_2$ on single crystal silicon underlie, the solid phase epitaxy in which an Ni film reacts with a Si substrate (e.g., S.Saitoh et al., Japan J. Appl. Phy., 20 (1931) p 1649), and the simultaneous deposition or co-deposition in which vaporized atoms of both Ni and Si are simultaneously deposited onto a Si substrate (e.g., J.C. Bean et al., Appl Phys. Lett., 37 (1980) p. 643). Although the solid phase epitaxy is easy in manufacturing process, it has the shortcomings that the reaction includes diffusion and hence Ni atoms may diffuse into Si substrate and that the resultant film surface has inferior morphology. Co-deposition has the advantages that the resultant silicide film can have good crystallinity, the resultant film surface can have good morphology and that less diffusion of Ni atoms occurs into the Si substrate, but it has the difficulty of maintaining the stoichiometry of Si and Ni, which imposes difficulty in practice.

There has also been known, as a method of growing epitaxially a $CoSi_2$ monocrystalline film on a single crystal silicon underlie, the solid phase epitaxy in which a Co film reacts with a Si substrate, as described for example in R.T. Tung et al., Appl. Phys. Lett., 40 (1982) p. 684. However, this method of forming a $CoSi_2$ film has the shortcomings of Co diffusion into Si and inferior morphology of the film surface as in the case of forming an $NiSi_2$ film by the solid phase epitaxy.

SUMMARY OF THE INVENTION

An object of this invention is to provide a method of solid phase epitaxy for forming a metal silicide film, and more particularly to provide a method of solid phase epitaxy for forming an $NiSi_2$ or $CoSi_2$ film capable of reducing influence on the silicon substrate.

Another object of this invention is to provide a method of solid phase epitaxy capable of providing easiness of manufacture comparable to the conventional solid phase epitaxy, and high crystallinity comparable to the co-deposition and of reducing influence on the silicon substrate.

The fundamental steps of this invention comprises laminating alternately films of desired metal and of a silicon on a single crystal silicon substrate, and heating the resultant substrate carrying the laminate to epitaxially grow a metal silicide in solid phase.

For the formation of a $CoSi_2$ film or Co—Si multilayer structure, the substrate temperature is set to 450–1000° C., preferably 600–800° C. Growth of single crystal can take place at 450° C. on a clean Si substrate surface, but the crystal quality is not good enough, as in the case of the $NiSi_2$ film. A single crystal film with good crystallinity and a very flat surface to the order of monoatomic layers can be grown in a temperature range of 600–750° C. If the substrate is heated above 800° C., particularly to 900° C., the film surface becomes rough although crystallinity is good. In extreme cases, holes may appear in the $CoSi_2$ film to expose the underlying silicon substrate surface.

Accordingly, the substrate temperature range of 600–800° C. is optimal for the solid phase epitaxial growth of $CoSi_2$.

DETAILED DESCRIPTION OF THE INVENTION

Figure 1:
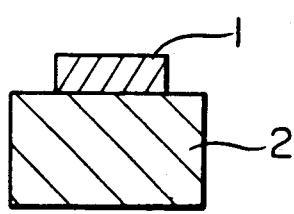
FIG. 1 is a set of cross-sectional views of a layer produced by the conventional solid phase epitaxy, in which section (a) shows a cross-section after an Ni film has been formed on a substrate, and section (b) shows a cross-section after the final solid phase epitaxy of the Ni—Si structure into a $NiSi_2$ film.
Figure 1:
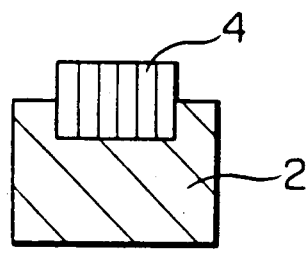

The principle of this invention will be described in detail hereinbelow by takinq examples where Ni or Co is employed as a metal.

The conventional solid phase epitaxy has the shortcomings that $NiSi_2$ film may be grown due to nucleation caused by the reaction with the silicon substrate and that since diffusion of Si and Ni (or Co, totally referred to as M) is indispensable, M atoms may be dissolved in the silicon substrate as a solid solution. These drawbacks of the conventional solid phase epitaxy can be obviated by preventing the solid phase reaction of the metal with the silicon substrate and yet allowing the epitaxial growth of metal silicide complied with the silicon substrate. For achieving these goals, a multilayer structure of Si and M aiming a stoichiometric composition of $MSi_2$ is formed at a substrate temperature below 350° C., preferably 25–200°, for $NiSi_2$ or below 450° C., preferably 25–300° C., for $CoSi_2$ such that the reaction of deposited atom with the underlying Si substrate hardly occurs. When the composition is deviated from that of $NiSi_2$, a substrate temperature above 350° C., particularly above 450° C., is undesirable because reaction between the silicon substrate and the deposited film formed on the substrate becomes significant. Also when the composition is deviated from that of $CoSi_2$, a substrate temperature above 450° C., particularly above 550° is undesirable because reaction between the silicon substrate and the deposited film formed on the substrate becomes significant. The multilayer structure as a whole is arranged to have a composition of $MSi_2$ at which lattice mismatch with Si is little, epitaxial growth takes place easily, and $MSi_2$ is stable in coexistent phase with Si. If the composition ratio of Si to M, i.e., Si/M, is greater than two, excessive silicon will undesirably segregate in the MSi$_2$ film in the epitaxy process. If, on the other hand, Si/M is smaller than 1.8, deficient Si atoms for forming an MSi$_2$ film will be supplied by diffusion of Si atoms from the silicon substrate, resulting undesirably in an inferior morphology of the MSi$_2$ film surface. A multi-layer structure of Si and M deposited at a substrate temperature below 200° C. and having a very small thickness of each component layer ranging 30-300 A, includes far more crystal defects than the single crystal substrate and hence makes the diffusion easier. Therefore, a uniform MSi$_2$ phase can be achieved without causing reaction with the silicon substrate through a low-temperature annealing process at 350° C. for 30 minutes for the formation of an NiSi$_2$ film or at 450° C. for 30 minutes for the formation of a CoSi$_2$ film. Particularly, in forming an NiSi$_2$ film, partial formation of the NiSi (nickel-mono-silicide) compound layer was observed even at an annealing temperature below 100° C. The annealing temperature in forming NiSi$_2$ (for intermixing between Si and Ni (or SiNi) multilayers) is preferably selected in the range of 350-450° C., and that of CoSi$_2$ is 450-550° C. from the viewpoint of preventing the reaction with the silicon substrate. The processing step of forming an MSi$_2$ film from the multi-layer structure is carried out desirably at a temperature which does not create polycrystal. Prior to the solid phase epitaxial growth, which will be described below, the films need be amorphous (or microcrystalline). If the films are stable polycrystalline, solid phase epitaxial growth becomes difficult an requires a higher temperature for the solid state epitaxy. The above-mentioned temperature ranges meet this condition. This condition does not change by the number of layers. The step of forming a MSi$_2$ amorphous (or micro-crystalline) film from the multi-layer structure, however, may be omitted and the multi-layer structure may directly be subjected to epitaxial growth.

The substrate is then heated to effect solid phase epitaxial growth of an MSi$_2$ epitaxial film on the single crystal silicon substrate from the MSi$_2$ amorphous (or micro-crystalline) film or the M—Si multi-layer. The substrate temperature is set to 350-750° C., preferably 500-650° C., for forming an NiSi$_2$ epitaxial film from the NiSi$_2$ amorphous (or micro-crystalline) film or Ni—Si multi-layer structure. Epitaxial growth can take place at 350° C. on a clean Si substrate surface, but the crystallinity is not very good. A single crystal film with good crystallinity and a very flat surface to the order of monoatomic layers can be grown in a temperature range of 500-650° C. If the substrate is heated above 650° C., particularly to 750° C., the film surface becomes rough although the crystallinity is good. In extreme cases holes may appear in the NiSi$_2$ film to expose the underlying silicon substrate surface. Accordingly, the substrate temperature range of 500-650° C. is optimal for the solid phase epitaxial growth of NiSi$_2$.

Embodiment 1

A (111) oriented silicon single crystal substrate was placed in the molecular beam epitaxy chamber, and the substrate surface was cleaned by the low-temperature thermal etching in the ultra high vacuum of the order of 10$^{-10}$ torr. Next, the substrate temperature was lowered to the room temperature and Si layers and Ni layers were alternately deposited by molecular beams, four layers each, at intervals of 175 A (for Si) and 50 A (for Ni), respectively. Thereafter, the substrate was heated to 600° C. for 30 minutes. It was confirmed by the reflective high energy electron diffraction that a single crystal pattern was obtained and that the epitaxial growth of (111) oriented film took place on the (111) silicon substrate. It was also confirmed by the analysis of Auger electron spectroscopy that NiSi$_2$ was created as indicated by the Si LVV peak which is a characteristic line of NiSi$_2$. Observation of the cross-section showed that the Ni—Si$_2$ did not react with and intrude into the substrate silicon, different from the case of the conventional solid phase epitaxy as shown in section (b) of FIG. 1.

Figure 2:
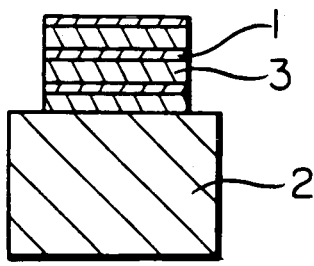
FIG. 2 is a set of cross-sectional views of the layer produced by the inventive solid phase epitaxy, in which section (a) shows a cross-section after the Ni—Si multilayer structure has been deposited on a Si substrate and section (b) shows a cross-section after the solid phase epitaxy from the multi-layer structure into an epitaxial $NiSi_2$ film.
Figure 2:
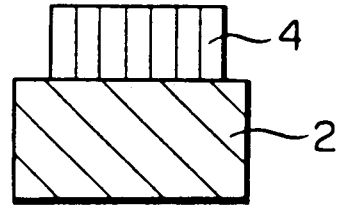
Figure 3:
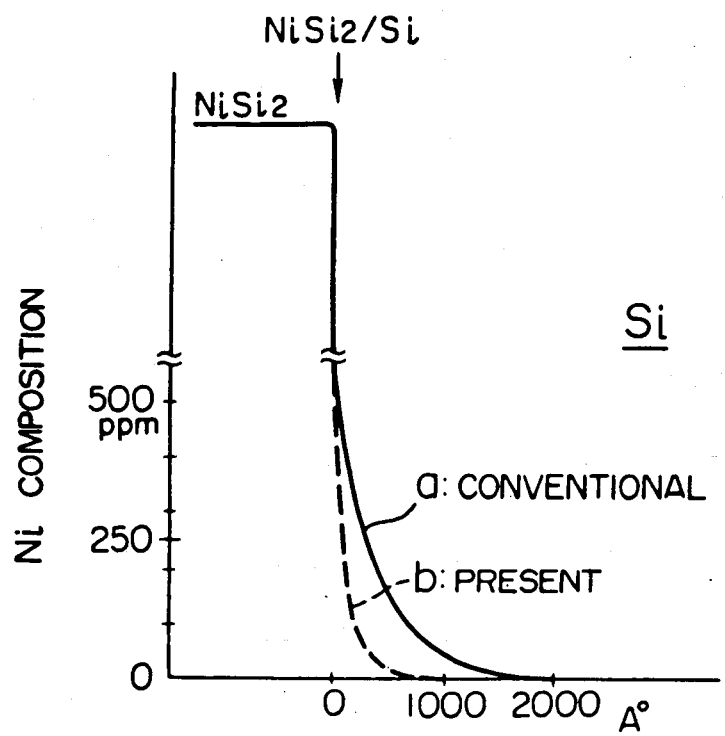
FIG. 3 is a graph showing the analytical result in the depth direction of Ni content by the secondary ion mass spectroscopy (SIMS)

According to the inventive method, Ni layers 1 and Si layers 3 were laminated on a silicon substrate 2 as shown in section (a) of FIG. 2, and the solid phase epitaxial growth was conducted to grow an NiSi$_2$ epitaxial layer as shown in section (b) of FIG. 2. Observation of Nomarski interference fringes with an optical microscope showed no structure indicating that the surface morphology is mirror-like. The SIMS analysis in the depth direction showed that width of hetero-interface (transient region) was 2000 A in the case of the conventional solid phase epitaxy as indicated by curve a in FIG. 3, whereas it was about 500 A in the case of the inventive solid phase epitaxy as indicated by curve b in FIG. 3. The width of hetero-interface is comparable to the error range of the analysis which is due to the collision of ions occurring in ion-sputtering the target. Thus, it became apparent that diffusion of Ni atoms into the silicon substrate is very low according to the inventive method.

In conclusion, this embodiment enables: (1) formation of an epitaxial NiSi$_2$ film without the reaction with Si atoms in the substrate, at easiness of manufacture comparable to that of the conventional solid phase epitaxy and with good quality comparable to that achieved by the co-deposition method, and (2) very low diffusion of Ni atoms into the semiconductor layer.

Embodiment 2

Figure 4:
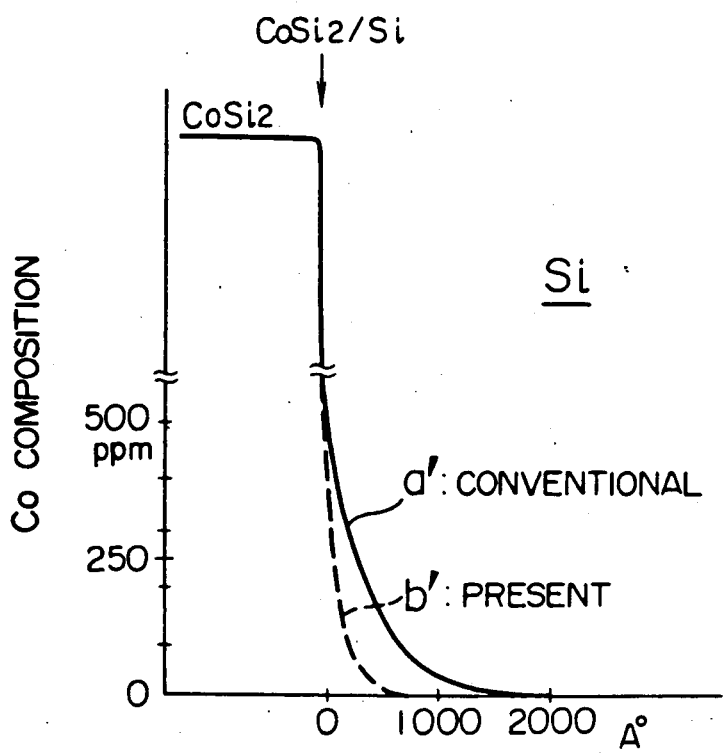
FIG. 4 is a graph showing the analytical result in the depth direction of Co content by the SIMS.

A silicon (111) monocrystalline substrate was placed in the molecular beam epitaxy chamber, and cleaning of the surface was achieved by the low-temperature thermal etching in the ultra high vacuum of the order of 10$^{-10}$ torr. Next, Si layers and Co layers were alternately formed, four layers each, at intervals of 172 A and 50 A, respectively, at the room temperature. Thereafter, the substrate was heated to 600° C. for 30 minutes to form a CoSi$_2$ film in substantially the same way as in Embodiment 1. It was proved by the reflective high energy electron diffraction method that a monocrystalline pattern was obtained and the epitaxial growth took place on the silicon substrate (111) surface. It was also proved by the analysis of Auger electron spectroscopy that CoSi$_2$ was created as indicated by the Si LVV peak which is specific to CoSi$_2$. Observation of the cross-section showed that the CoSi$_2$ did not react with the substrate silicon in the growing process as in the case of the NiSi$_2$ film in Embodiment 1, and different from the case of the usual solid phase epitaxial method. Observation of Nomarski interference finges with an optical microscope showed no structure indicating that the surface morphology is a mirror quality. The IMA analysis in the depth direction showed that the width of hetero-interface by the usual solid phase epitaxy was 2000 A as indicated by a' in FIG. 4, whereas that by the inventive solid phase epitaxy was about 400 A as indicated by b' in the graph, similar to the case of the NiSi$_2$ film in Embodiment 1. The width of hetero-interface was comparable to the error range of the analysis which is due to the collison of ions occurring in ion sputtering the target. Thus, it became apparent that diffusion of Co atoms into the silicon substrate is very low according to the inventive method.

In conclusion, this embodiment enables: (1) formation of an epitaxial $CoSi_2$ film without the reaction with Si atoms in the substrate at easiness of manufacture comparable to that of the conventional solid phase epitaxy and with good quality comparable to that achieved by the co-deposition method, and (2) very low diffusion of Co atoms into the semiconductor layer.

We claim:

1. A method of forming a nickel silicide film comprising the steps of:

forming a multi-layered laminate structure comprising a nickel film layer and a silicon film layer which layers are alternately and separately formed on a single crystal silicon substrate, the forming temperature of said nickel film layer and that of said silicon film layer being in a range of 25° C. to 200° C., a thickness of each of said film layers being in the range of 30 to 300 Å, an overall atomic number ratio of said silicon to said nickel being in the range of 1.8 to 2.0; and heating said multi-layered laminate structure so that alternate silicon film layers and nickel film layers in said multi-layered laminate structure change into monocrystalline nickel silicide, the heating temperature of said multi-layered laminate structure being in the range of 350 to 750° C.; and said monocrystalline nickel silicide being formed on said silicon substrate without intrusion of nickel silicide into said silicon substrate.

2. A method according to claim 1, wherein said nickel film layer and silicon film layer which are alternatley formed on said substrate are amorphous films.

3. A method according to claim 2, wherein said heating temperature of said multi-layered laminate structure is in the range of 500 to 650° C.

4. A method of forming a cobalt silicide film comprising the steps of:

forming a multi-layered laminate structure comprising a cobalt film layer and a silicon film layer, which layers are alternately and separately formed, on a single crystal silicon substrate, the forming temperature of said cobalt film layer and that of said silicon film layer being in a range of 25° C. to 300° C., a thickness of each of said film layers being in the range of 30 to 300 Å, an overall atomic number of ratio of said silicon to said cobalt being in the range of 1.8 to 2.0; and heating said multi-layered laminate structure so that alternate silicon film layers and cobalt film layers in said multi-layered laminate structure change into moncrystalline cobalt silicide, the heating temperature of said multi-layered laminate structure being in the range of 450 to 1,000 ° C.; and said monocrystalline cobalt silicide being formed on said silicon substrate without intrusion of cobalt silicide into said silicon substrate.

5. A method according to claim 4, wherein said cobalt film layer and said silicon film layer which are alternately formed on said substrate are amorphous films.

6. A method according to claim 5, wherein said heating temperature of said multi-layered laminate structure is in the range of 600 to 800° C.

7. A method of forming a nickel silicide film comprising the steps of:

forming a multi-layered laminate structure comprising a nickel film layer and a silicon film layer which layers are alternately and separately formed on a single crystal silicon substrate, the forming temperature of said nickel film layer and that of said silicon film layer being in a range of 25° C. to 200° C., a thickness of each of said film layers being in the range of 30 to 300 Å, an overall atomic number ratio of said silicon to said nickel being in the range of 1.8 to 2.0;

annealing said multi-layered laminate structure at 350 to 450° C.; and heating said multi-layered laminate structure so that alternate silicon film layers and nickel film layers in said multi-layered laminate structure change into monocrystalline nickel silicide, the heating temperature of said multi-layered laminate structure being in the range of 500 to 650° C.; and said monocrystalline nickel silicide being formed on said silicon substrate without intrusion of nickel silicide into said silicon substrate.

8. A method of forming a cobalt silicide film comprising the steps of:

forming a multi-layered laminate structure comprising a cobalt film layer and a silicon film layer, which layers are alternately and separately formed, on a single crystal silicon substrate, the forming temperature of said cobalt film layer and that of said silicon film layer being in a range of 25° C. to 300° C., a thickness of each of said film layers being in the range of 30 to 300 Å, an overall atomic number ratio of said silicon to said cobalt being in the range of 1.8 to 2.0;

annealing said multi-layered laminate structure at 450 to 550° C.;

heating said multi-layered laminate structure so that alternate silicon film layers and cobalt film layers in said multi-layered laminate structure change into monocrystalline cobalt silicide, the heating temperature of said multi-layered laminate structure being in the range of 600 to 800° C.; and said monocrystalline cobalt silicide being formed on said silicon substrate without intrusion of cobalt silicide into said silicon substrate.

* * * * *